(12) United States Patent
Rodriguez et al.

(10) Patent No.: US 12,074,100 B2
(45) Date of Patent: Aug. 27, 2024

(54) FLAT NO-LEAD PACKAGE WITH SURFACE MOUNTED STRUCTURE

(71) Applicant: STMICROELECTRONICS, INC., Calamba (PH)

(72) Inventors: Rennier Rodriguez, Bulacan (PH); Aiza Marie Agudon, Calamba (PH); Maiden Grace Maming, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 720 days.

(21) Appl. No.: 17/131,222

(22) Filed: Dec. 22, 2020

(65) Prior Publication Data

US 2021/0111109 A1    Apr. 15, 2021

Related U.S. Application Data

(62) Division of application No. 15/808,680, filed on Nov. 9, 2017, now Pat. No. 10,892,212.

(51) Int. Cl.
*H01L 23/495* (2006.01)
*H01L 23/64* (2006.01)
*H01L 49/02* (2006.01)

(52) U.S. Cl.
CPC .. *H01L 23/49589* (2013.01); *H01L 23/49548* (2013.01); *H01L 23/647* (2013.01); *H01L 23/49575* (2013.01); *H01L 28/10* (2013.01); *H01L 28/20* (2013.01); *H01L 2224/48247* (2013.01); *H01L 2224/73265* (2013.01); *H01L 2924/181* (2013.01)

(58) Field of Classification Search
CPC ......... H01L 23/49589; H01L 23/49548; H01L 23/647; H01L 23/49575; H01L 28/10; H01L 28/20; H01L 2224/48247; H01L 2224/73265; H01L 2924/181; H01L 2224/32245; H01L 2924/19105; H01L 21/4821; H01L 23/4952; H01L 2924/00
USPC .......................................................... 257/666
See application file for complete search history.

(56) References Cited

U.S. PATENT DOCUMENTS

| | | |
|---|---|---|
| 7,095,112 B2 | 8/2006 | Endo et al. |
| 7,332,819 B2 | 2/2008 | Tan et al. |
| 7,355,278 B2 | 4/2008 | Shibata et al. |
| 8,017,445 B1 | 9/2011 | Chang et al. |
| 8,921,994 B2 | 12/2014 | Higgins, III |
| 10,109,563 B2 | 10/2018 | Rodriguez et al. |
| 10,204,873 B2 | 2/2019 | Cho et al. |
| 10,763,194 B2 | 9/2020 | Rodriguez et al. |
| 11,404,355 B2 * | 8/2022 | Rodriguez ........ H01L 23/49548 |
| 2002/0031869 A1 | 3/2002 | Minamio et al. |
| 2003/0001244 A1 | 1/2003 | Araki et al. |

(Continued)

FOREIGN PATENT DOCUMENTS

| | | |
|---|---|---|
| CN | 1472805 A | 2/2004 |
| CN | 202307386 U | 7/2012 |

(Continued)

*Primary Examiner* — Caleen O Sullivan
(74) *Attorney, Agent, or Firm* — Seed IP Law Group LLP

(57) ABSTRACT

The present disclosure is directed to a flat no-lead semiconductor package with a surfaced mounted structure. An end portion of the surface mounted structure includes a recessed member so that the surface mounted structure is coupled to leads of the flat no-lead semiconductor package through, among others, the sidewalls of the recessed members.

20 Claims, 8 Drawing Sheets

(56) References Cited

U.S. PATENT DOCUMENTS

| | | |
|---|---|---|
| 2004/0056337 A1 | 3/2004 | Hasebe et al. |
| 2005/0088806 A1* | 4/2005 | Kato ................... H01L 24/05 |
| | | 361/600 |
| 2005/0173783 A1* | 8/2005 | Chow ............... H01L 23/49548 |
| | | 257/E21.705 |
| 2007/0093000 A1 | 4/2007 | Shim et al. |
| 2011/0079886 A1 | 4/2011 | Bathan et al. |
| 2011/0147899 A1 | 6/2011 | Dahilig et al. |
| 2011/0193208 A1 | 8/2011 | Xue et al. |
| 2012/0074547 A1 | 3/2012 | Do et al. |
| 2013/0154068 A1 | 6/2013 | Sanchez et al. |
| 2015/0076675 A1 | 3/2015 | Real et al. |
| 2018/0190575 A1 | 7/2018 | Rodriguez et al. |
| 2019/0096788 A1* | 3/2019 | Rodriguez ........ H01L 23/49541 |

FOREIGN PATENT DOCUMENTS

| | | |
|---|---|---|
| CN | 103299382 A | 9/2013 |
| CN | 104064355 A | 9/2014 |
| CN | 209087825 U | 7/2019 |
| JP | 2007005637 A | 1/2007 |
| JP | 2008060427 A | 3/2008 |

\* cited by examiner

FLAT NO-LEAD PACKAGE WITH SURFACE MOUNTED STRUCTURE

BACKGROUND

Technical Field

The present disclosure is directed to a flat no-lead semiconductor package with a surface mounted structure and a surface mount device with a wettable sidewall.

Description of the Related Art

A typical leadframe package includes a semiconductor die having its backside coupled to a leadframe and its active side coupled to various electrical contacts. An encapsulant is then used to cover the combined die and leadframe to create the leadframe package. For a flat no-lead package, a specific type of leadframe package, the leads are exposed on a surface of the package but do not extend out beyond the sides of the package.

On a surface (bottom surface) of a flat no-lead package, leads may be positioned on either two sides of the package or four sides of the package surrounding the exposed thermal pad coupled to the semiconductor die. There might be other leads positioned between the sides of the package and the thermal pad and used for other connection functions

BRIEF SUMMARY

Examples of the present disclosure are directed to a leadframe package with a surfaced mounted structure coupled to exposed leads of the leadframe package through coupling medium. The leadframe of the leadframe package includes multiple exposed metal leads and a die pad on a surface of the leadframe. A semiconductor circuit die is mounted on the die pad and electrically coupled to some of the exposed metal leads. The surface mounted structure includes multiple end portions each coupled to an exposed lead. The surface mounted structure also includes an electrical element coupled between multiple end portions and is electrically coupled to the leadframe through the end portions.

An end portion may include a recessed member so that a coupling medium may be received in the recessed member and so that in addition to or instead of a flat surface for the coupling, the end portion of the surface mounted structure also includes a wettable side wall for the coupling to the exposed lead.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1A:
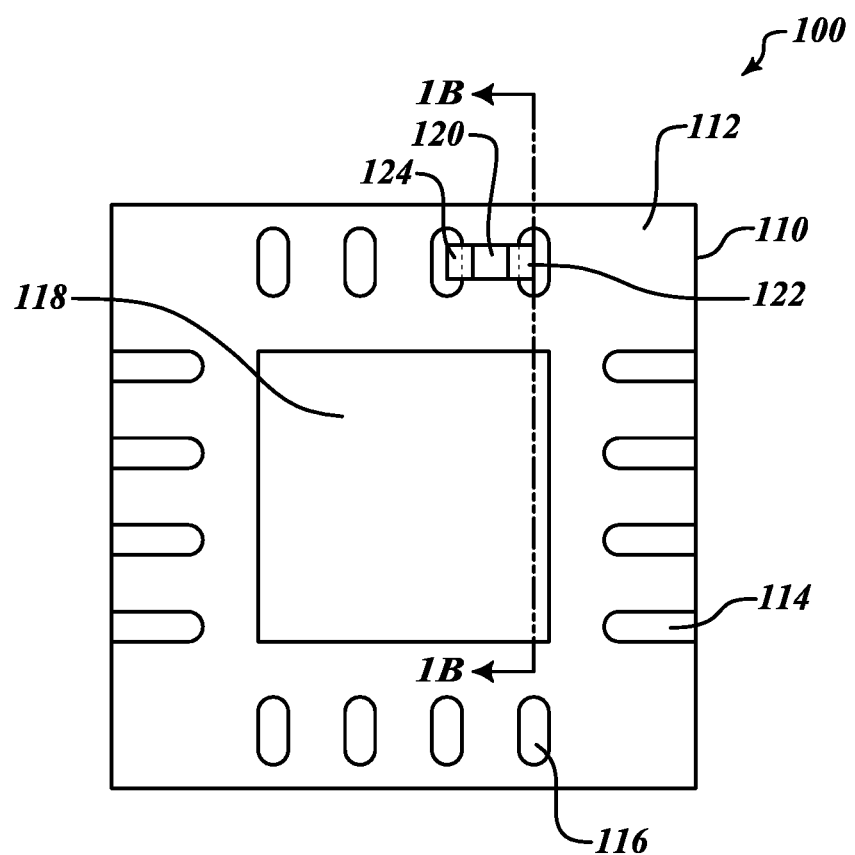
FIG. 1A is a plane view of a surface of a flat no-lead package with a surface mounted structure.

The present disclosure is generally directed to providing a leadframe package, e.g., a flat no-lead package, with a surface mounted structure. An example flat no-lead package (device) 100 including a substrate 110 and a surface mounted structure 120 is shown in FIG. 1A. In this example, a surface (e.g., top surface) 112 of substrate 110 (referred to herein as a "package") may include multiple exposed leads 114, 116. Exposed leads 114 are positioned on the side/edges of package 110. Normally, leads 114 on the sides of package 110 may be exposed also on the side walls (not shown), e.g., to facilitate soldering to a PCB. That is, leads 114 may extend to the outer peripherals of surface 112. Exposed leads 116 may be positioned within surface 112, i.e., not extending to the outer peripherals of surface 112, and may function to provide more possibilities of connections/interconnections.

One or more semiconductor circuit die 118 is mounted on the top surface 112 of the package 110 using known techniques. The die 118 may include a plurality of circuits therein and bond pads on the bottom where it connects to leads (or pad) similar to leads 116. The leads under the die 118 cannot be seen because the die overlays and fully covers the leads, as is well known in the art. There package 110 is comprised of a large number of laminated conductive and insulating layers that provide for electrical connection from the die 118 to the various leads 114 and 116 in a manner known in the art.

A surface mounted structure 120 may be mounted on surface 112 of substrate 110. Specifically, surface mounted structure 120 may include one or more (shown as two) end portions 122, 124 each coupled to an exposed lead 114, 116 (shown as coupled to two leads 116). End portions 122, 124 may be coupled to exposed leads 116 through a coupling medium, e.g., a solder paste and/or an adhesive. An adhesive may include an electrically conductive glue or an epoxy. Other coupling medium/materials, e.g., other die attach films, are also possible and included in the disclosure. This surface mounted structure 120 will be coupled by lead lines within the substrate 110 to particular pins or pads of the die 118 and insulating layers will be above and below these lead lines to electrically insulate them from each other.

Figure 1B:
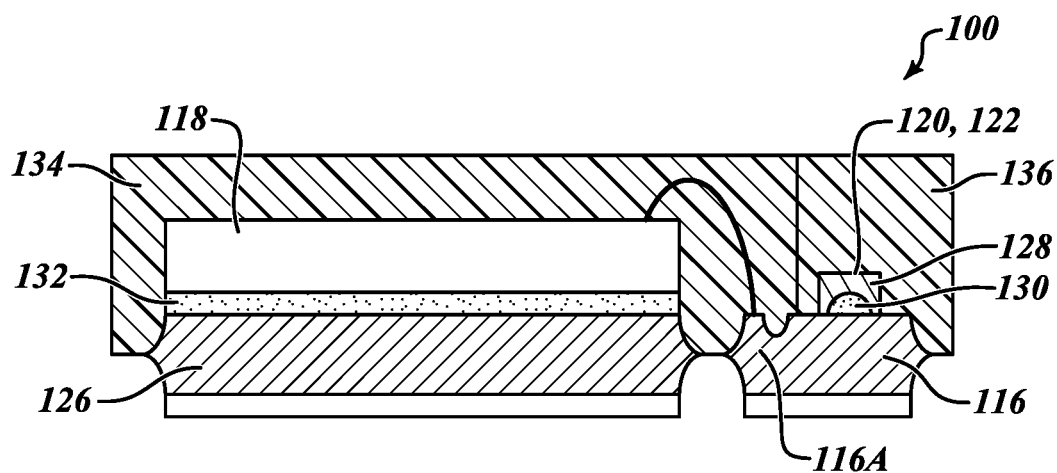
FIG. 1B is a cross-sectional view of the flat no-lead package of FIG. 1A.

FIG. 1B shows an example cross-section view of device 100 from cutting line 1B-1B. Referring to FIG. 1B, die 118 is attached to die pad 126 which is part of a same leadframe as lead 116. Die 118 may be wired to metal portion 116A which may be an integral portion of lead 116 or may be connected to lead 116 through a leadline(s). End portion 122 of surface mounted device 120, shown with an edge surface 128, is coupled to lead 116 via a coupling medium 130. FIG. 1B also shows that a die attach layer 132, e.g., an adhesive, is positioned between die 118 and die pad 126. Die 118 may be encapsulated by an encapsulation layer 134 of, e.g., molding compounds. Surface mounted device 120 may be encapsulated by an encapsulation layer 136 of, e.g., molding compounds. It should be appreciated that encapsulation layers 134 and 136 may be a same encapsulation layer formed with a same process step or may be formed with different process steps. For example, it is possible that die 118 is encapsulated first and surface mounted device 120 is coupled to leads 116 and encapsulated in another later process.

As shown in FIG. 1B, as an example, semiconductor die 118 and surface mounted structure 120 are attached to the same surface 112 of substrate 110. This example is not limiting and semiconductor die and surface mounted structure 120 may be attached to oppose surfaces of substrate 110, which is also included in the disclosure.

Figure 2:
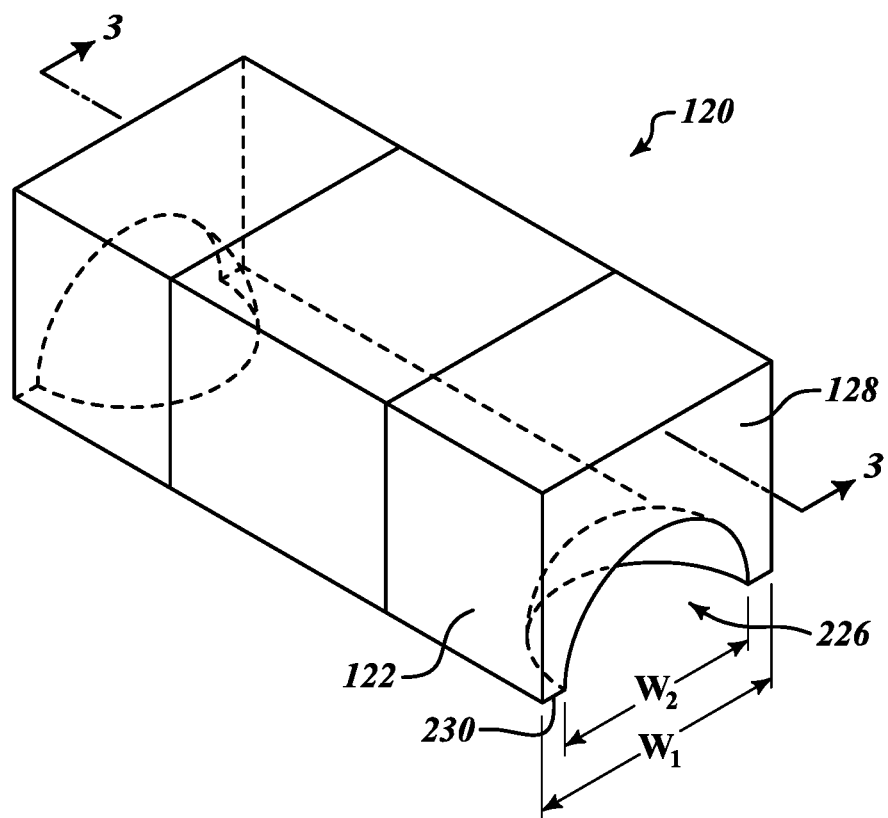
FIG. 2 is a conceptual three dimensional view of a surface mounted structure.

FIG. 2 shows a conceptual three-dimensional view of surface mounted structure 120. As shown in FIG. 2, end portion 122 of surface mounted structure 120 may include a recessed member 226 on an edge surface 128 of end portion 122. In an example, recessed member 226 is a cavity portion defined within edge surface 128 of end portion 122. That is, a height of the recess (cavity) portion 226 is smaller than a height of the end portion 122 at edge surface 128 and a width W2 of the recess portion 226 is smaller than a width W1 of end portion 122 at edge surface 128. The term recess is used herein in the broadest sense and includes within its meaning a cavity, cavity portion, step, indent, convex region, crater, reduced width or other words that signify a deep region that is below a surface adjacent to it. Therefore, the terms such as recess, cavity, crater, and step may be used to have similar overall meanings, but with slight differences in shape or nuance, or in some cases, as interchangeable herein. In an example, width W2 of cavity portion 226 is equal to or greater than 75% of width W1 of end portion 122 at edge surface 128. In a further example, cavity portion 226 is a partial crater portion with a widest part on the bottom in line with bottom edge 230 of end portion 122 at edge surface 128. Cutting line A-A' may indicate a cutting—plane through a highest point of recession portion 226.

Figure 3:
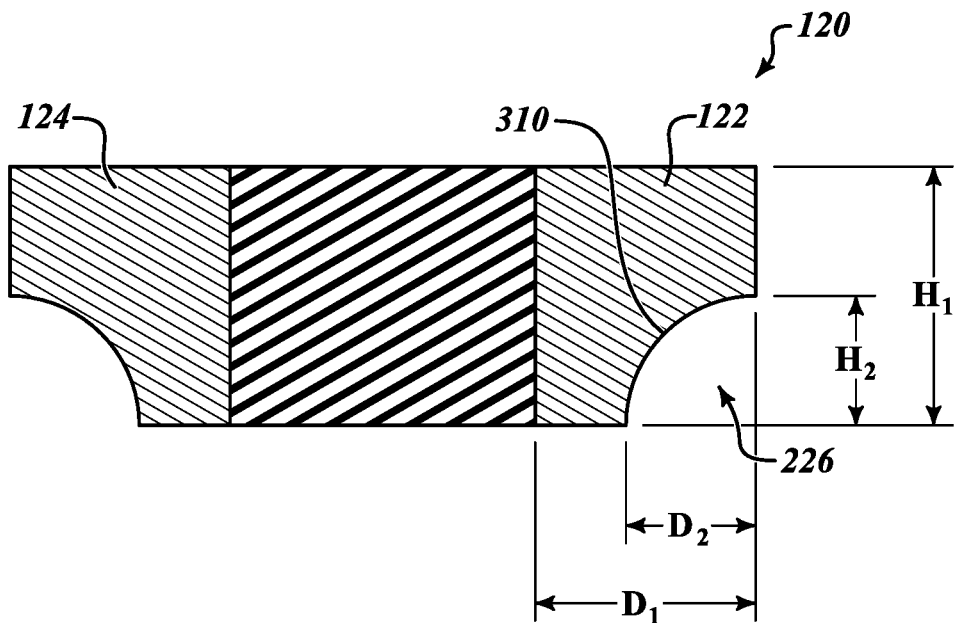
FIG. 3 is a cross-sectional view of a surface mounted structure.

FIG. 3 is a conceptual cross-sectional view of surface mounted structure 120 through cutting line 3-3. As shown in FIG. 3, a height H2 of recessed member 226 (at the highest point thereof) is smaller than a height H1 of the end portion 122 at edge surface 128 (not shown). In an example, height H2 of recessed member 226 is equal to or greater than a half of height H1 of end portion 122. A depth D2 of recessed member 226 is smaller than a depth D1 of the end portion 122. In an example, end portion 122 is a terminal portion of surface mounted structure 120 for electrical connections.

Figure 4:
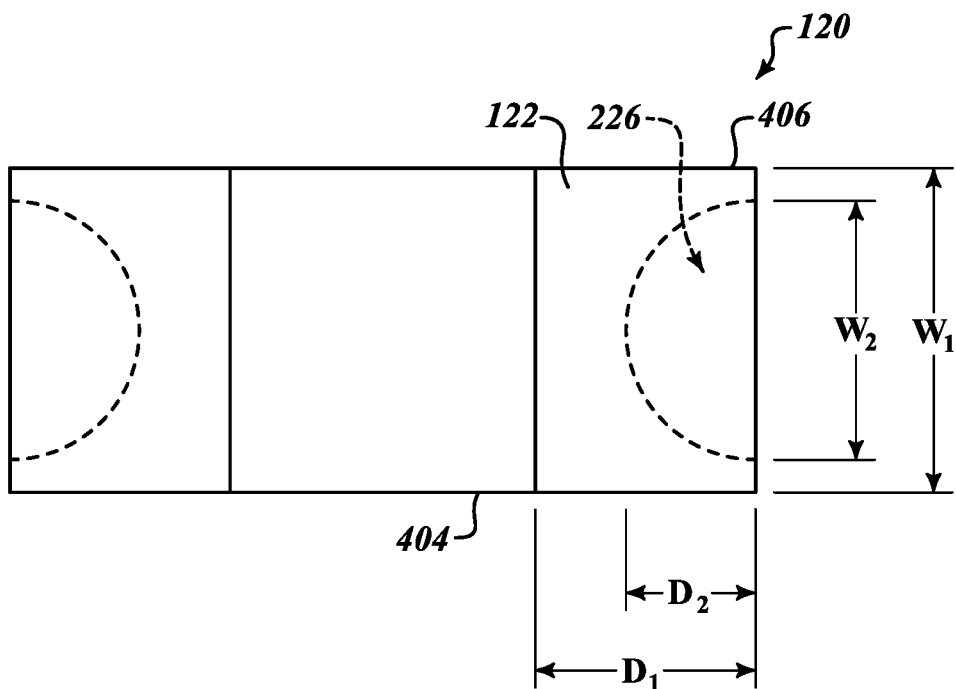
FIG. 4 is a plane view of a top surface of a surface mounted structure with a projection view of a recessed member.

FIG. 4 is a conceptual plane view of a top surface of surface mounter structure 120 with a projection view of recessed member 226. As shown in FIG. 4, recess (cavity) portion 226 is defined within sidewalls 404 and 406 of end portion 122. In an example, width W2 of cavity portion 226 is equal to or greater than 75% of width W1 of end portion 122 at edge surface 128. In a case that cavity portion 226 is a partial crater portion, width W2 of the partial crater portion 226 at bottom edge 230 (see FIG. 2) of end portion 122 is equal to or greater than seventy five percent of width W1 of end portion 122 at edge surface 128. A depth D2 of recessed member 226 is smaller than a depth D1 of the end portion 122. Other relative sizes of recessed member 226 relative to end portion 122 are also possible and included in the disclosure.

Figure 5A:
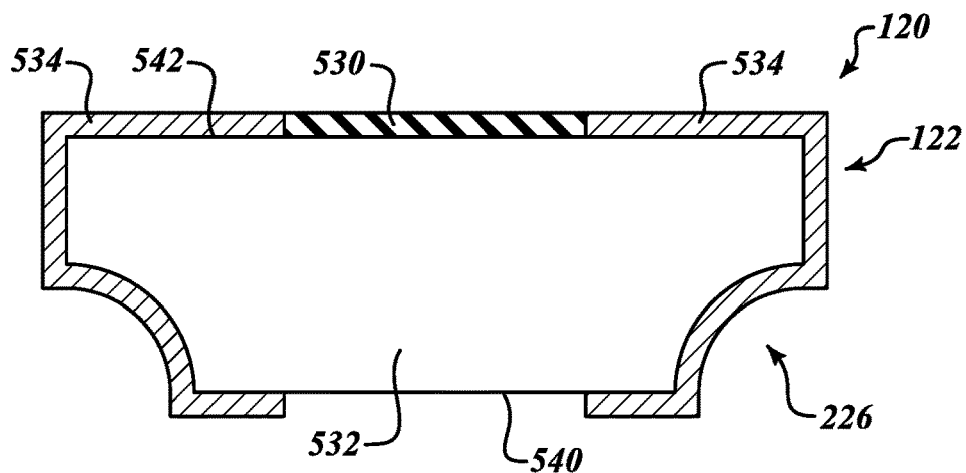
FIGS. 5A-5F are cross-sectional views of various examples of a surface mounted structure.

FIGS. 5A-5F are cross-sectional views of various examples of surface mounted structure 120. Referring to FIG. 5A, surface mounted structure 120 may include an example passive semiconductor element 530 (e.g., a resistive thin film made of, e.g., NiCr), a substrate 532 made of, e.g., alumina ceramics, silicon, or glass and a connection element(s) 534 about recessed member 226. In an example, as shown in FIG. 5A, connection element 534 may be a copper terminal 534 that overlaps a first surface (bottom surface) 540 of surface mounted structure 120 that when mounted to substrate 110, opposes surface 112 of substrate 110. Copper terminal 534 may further extends through recession portion 226 and to a second surface (top surface) 542 of surface mounted structure 120 that opposes first surface (bottom surface) 540. That is, copper terminal 534 at least partially defines recessed member 226. End portion 122/124 may be the portions of surface mounted structure 120 where connection element 534 extends to.

Copper terminals 534 connect to passive semiconductor element 530. As shown in the cross-sectional view in FIG. 5A, copper terminal 534 is coplanar with passive semiconductor element 530 on second surface 542. As copper terminal 534 and passive semiconductor element 530 together may not cover the full surface of second surface 542, some filling layers, e.g., of molding compounds, may be optionally applied. In an example, copper terminal 534 may extend all the way between opposing sidewalls 404, and 406 of surface mounted structure 120 (FIG. 4) on at least one of first surface 540 and second surface 542.

Figure 5B:
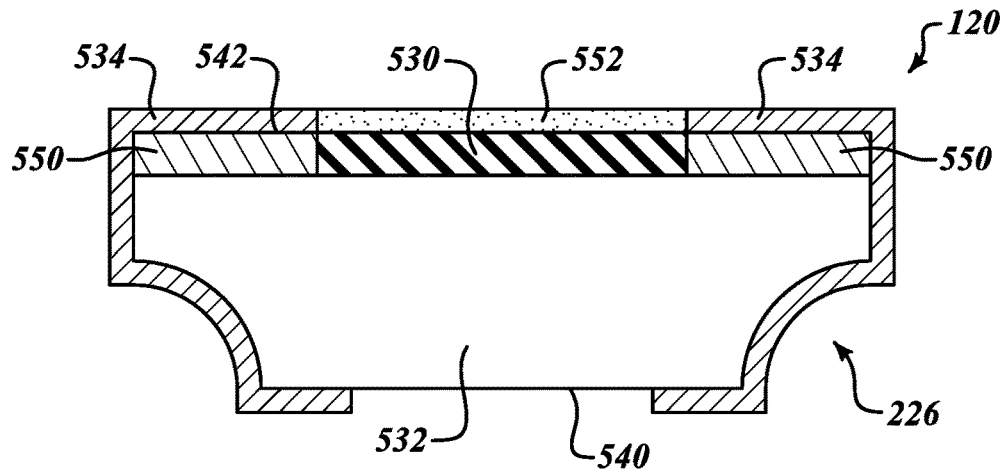

FIG. 5B shows another example of surface mounted structure 120. Different than the example of FIG. 5A, structure of FIG. 5B may include a base connection layer 550 coupled to (or integrated with) passive semiconductor element 530 on a same plane. Copper terminal 534 overlaps and connects to base connection layer 550. A protective coating layer 552, e.g., epoxy or molding compound, may be disposed over passive semiconductor element 530 and coplanar with copper terminal 534. It should be appreciated that copper terminal 534 may not extend all the way till passive semiconductor element 530 and may partially overlap with base connection layer 550, which is also partially covered by protective coating layer 552.

Figure 5C:
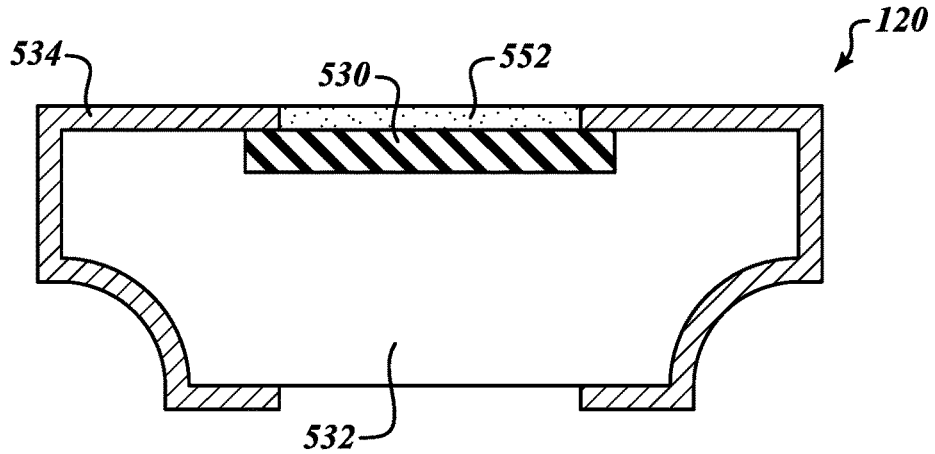

FIG. 5C shows another example of surface mounted structure 120. Different than the example of FIG. 5B, structure of FIG. 5C may have passive semiconductor element 530 (or passive semiconductor element 530 and the integrated/coupled base connection layer 550) embedded in substrate 532.

Figure 5D:
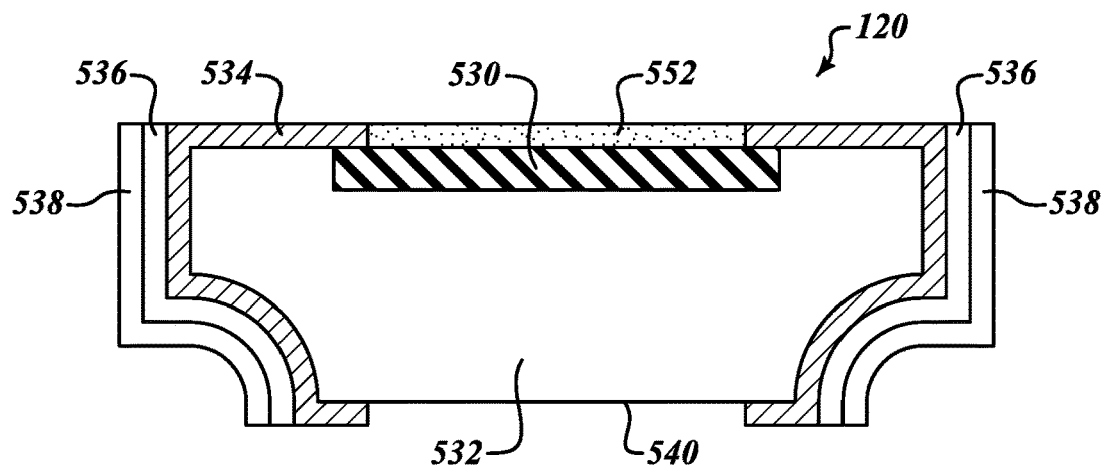

FIG. 5D shows another example of surface mounted structure 120. Different than the example of FIG. 5C, connection element 534 may be an electroplated terminal layer that includes, in addition to the copper terminal layer, a nickel plating layer 536 and a tin plating layer 538. In an example, nickel plating layer 536 and tin plating layer 538 may be disposed only over the vertical portion of the copper terminal layer and do not overlap either one of first surface 540 and second surface 542.

Figure 5E:
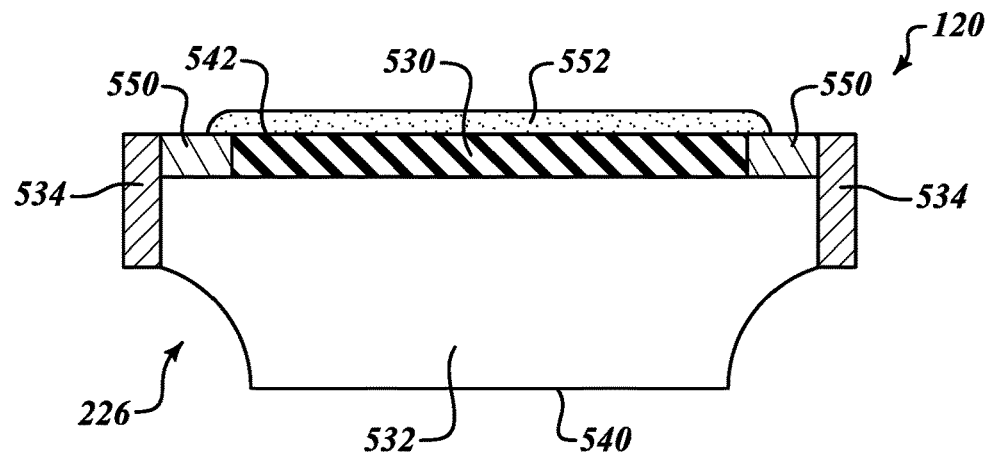

FIG. 5E shows another example of surface mounted structure 120. In FIG. 5E, connection element 534 is disposed about recessed member 226 and is over edge surface 128 (see FIG. 2) of surface mounted structure 120. Connection element 534 of FIG. 5E only defines the upper portion of recessed member 226. Connection elements 534 are connected to passive semiconductor element 530 through base connection layer 550 that may be part of connection element 534, part of passive semiconductor element 530 or a separate element.

Figure 5F:
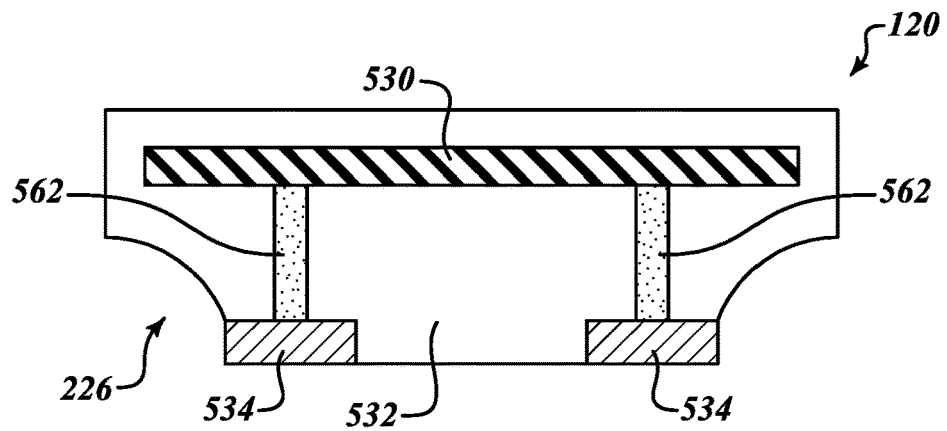

FIG. 5F shows another example of surface mounted structure 120. As shown in FIG. 5F, connection elements 534 are in the form of connection pads/plates about recessed member 226. Connection element 534 of FIG. 5F only defines the lower portion of recessed member 226. Passive semiconductor element 530 may be coupled to connection pads/plates 534 through connection holes/vias 562.

It should be appreciated that example passive semiconductor element 530 may be a resistive element (thin film or thick film), a capacitive element, a magnetic element (inductive), a memrisor, sensors, or any other passive semiconductor elements.

It should also be appreciated that although a surface mounted structure/device 120 of a passive semiconductor element is used herein for illustrative purposes, other surfaced mounted structures/devices of active components therein are also possible and included in the disclosure. Various solutions to provide power supply to the active components through the leads of substrate 110 or through other channels are possible and do not limit the scope of the disclosure.

Figure 6A:
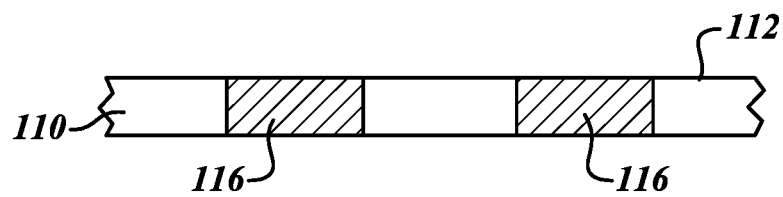
FIGS. 6A-6C are cross-sectional views of various stages of a process of coupling a surface mounted structure to a flat no-lead package.
Figure 6B:
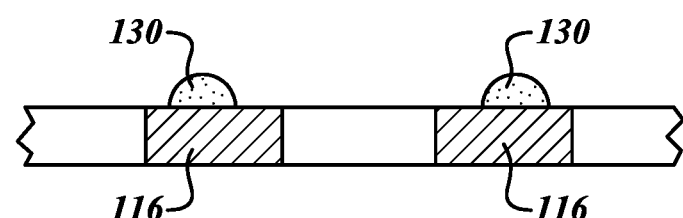
Figure 6C:
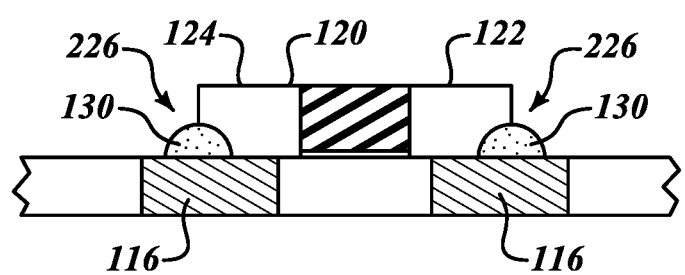

FIGS. 6A to 6C show various stages of a method of making device 100 including a substrate 110 and a surfaced mounted structure 120. As shown in FIG. 6A, leads 114/116 (shown as 116) exposed on surface 112 of substrate 110 are prepared (e.g., cleaned) for mounting surface mounted structure 120.

In FIG. 6B, coupling medium 130, e.g., an electrically conductive adhesive, is applied on exposed lead 116.

In FIG. 6C, surface mounted structure 120 is mounted on to surface 112 through coupling medium 130. Specifically, the two end portions 122,124 of surfaced mounted structure 120 each is attached to a lead 116 through coupling medium 130, where recessed members 226 of the end portions 122, 124 receive at least partially coupling medium 130 so that surface mounted structure 120 is attached to exposed leads 116 through, among others, sidewalls of recessed members 226.

Figure 7:
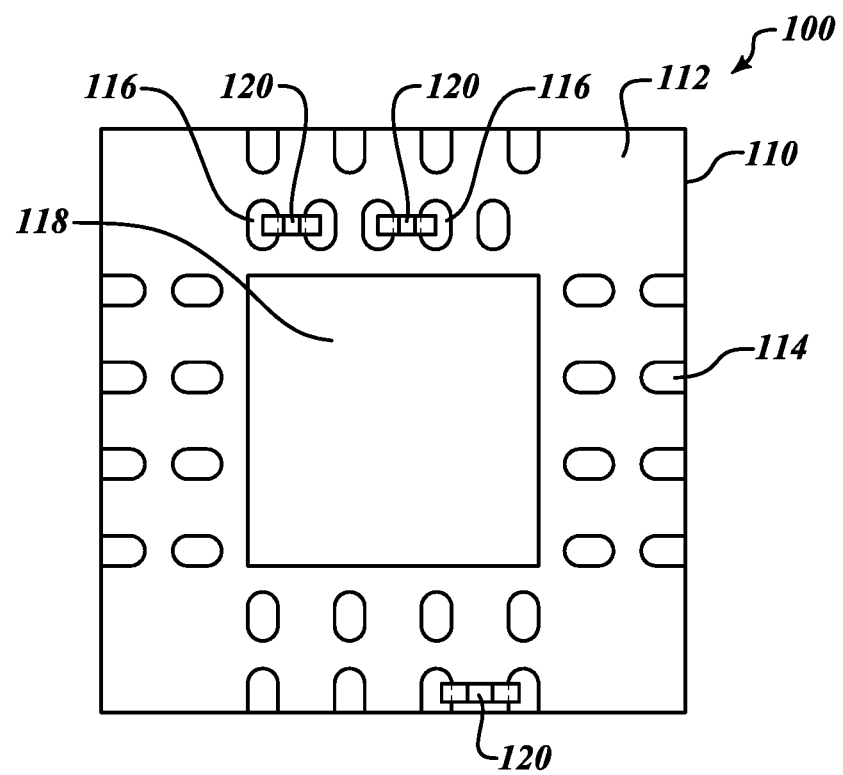
FIG. 7 is a plane view of a surface of another flat-no-lead package with a surface mounted structure.

FIG. 7 shows another example of device 100. As shown in FIG. 7, substrate 110 may include multiple layers of exposed leads including the outermost layer of leads 114 and an inner layer(s) of leads 116. Surfaced mounted structure 120 may be coupled to any exposed leads, depending on the specific application scenarios, including the outermost layer leads 116 and/or the inner layer leads 114.

Figure 8A:
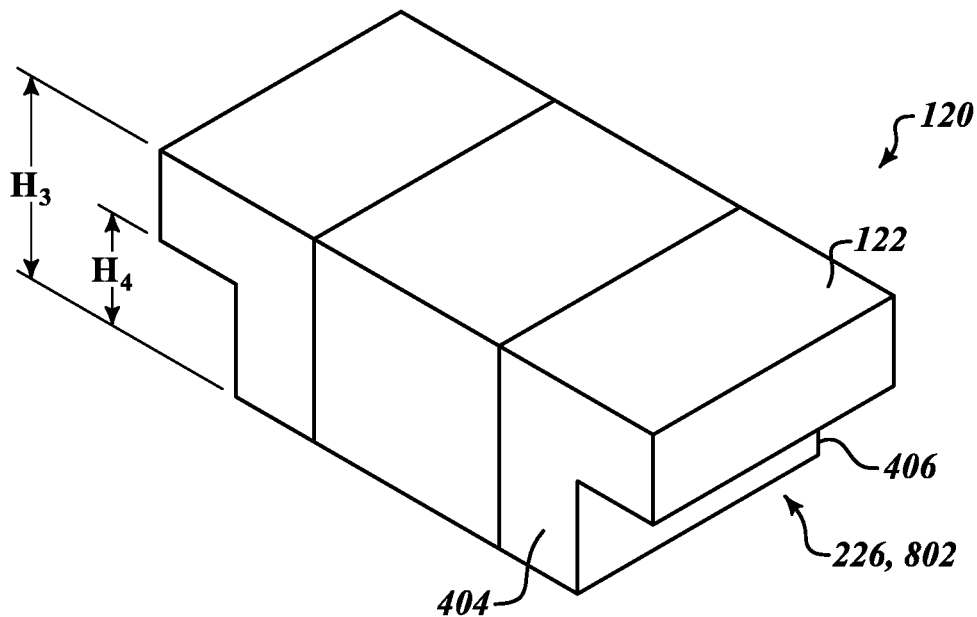
FIG. 8A is a conceptual three-dimensional view of another example of a surface mounted structure.
Figure 8B:
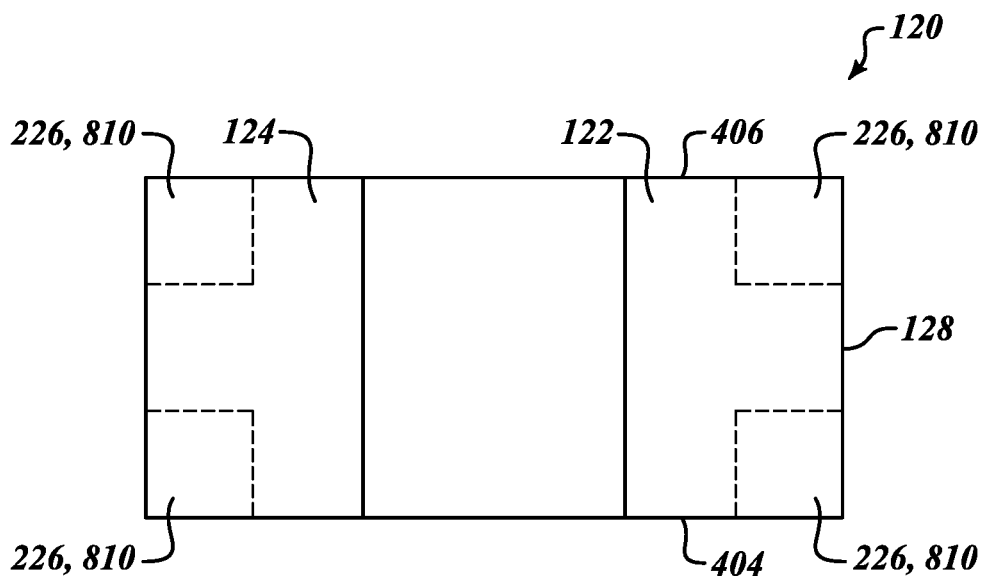
FIG. 8B is a plane view of a top surface of another example surface mounted structure with a projection view of multiple recessed members.

FIGS. 8A and 8B show other examples of recessed member 226 of surfaced mounted structure/device 120. As shown in FIG. 8A, recessed member 226 of end portion 122 is in a form of a step portion 802 that extends through two opposing side walls 404, 406 of surface mounted structure 120. In an example, a height H4 of the step portion 802 is equal to or greater than a half of a height H3 of surface mounted structure 120.

FIG. 8B shows that in an end portion 122, there might be multiple recessed members 226. As shown in the example surface mounted structure 120 of FIG. 8B, end portions 122, 124 each includes two recessed members 226, 810. Recessed member 810 recesses from both the edge surface 128 and the relevant sidewall 404, 406 of surface mounted structure 120. Other configurations of recessed member 226 are also possible and included in the disclosure. For example, recessed member 226 may be disposed on sidewalls 404 and/or 406 only and not in edge surface 128.

In the description herein, a flat no-lead package is used as an example of a leadframe package. It should be appreciated that surface mounted structure 120 described herein may be mounted to any leadframe package that includes exposed metal lead(s). Further, the described surface mounted structure/device may also be mounted to other structures, like a printed circuit board (PCB), which is also included in the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
applying a coupling medium to an exposed lead on a surface of a leadframe substrate that includes a semiconductor die mounted on a pad of the leadframe substrate; and
mounting a semiconductor device onto the surface of leadframe substrate by attaching an end portion of the semiconductor device to the exposed lead via the coupling medium, the end portion including a recessed member to receive at least partially the coupling medium.

2. The method of claim 1 wherein the mounting the semiconductor device includes mounting the semiconductor device having the recessed member that includes one of a step portion extending through two opposing sidewalls of the end portion or a cavity portion defined within the two opposing sidewalls of the end portion.

3. The method of claim 1 wherein the mounting the semiconductor device includes mounting the semiconductor device having a first end portion and a second end portion each including a recessed member, the end portion being one of the first end portion or the second end portion, and the semiconductor device includes an electrical element coupled between the first end portion and the second end portion.

4. The method of claim 1 wherein the mounting the semiconductor device includes mounting the semiconductor device using the coupling medium of an electrically conductive adhesive.

5. The method of claim 1 wherein the mounting the semiconductor device includes mounting the semiconductor device having the recessed member that is a step portion extending through two opposing side walls of the end portion.

6. The method of claim 1 wherein the mounting the semiconductor device includes mounting the semiconductor device having the recessed member that is a cavity portion on an edge surface of the end portion.

7. The method of claim 6 wherein the cavity portion is a partial crater portion.

8. The method of claim 1 wherein a height of the recessed member is equal to or greater than a half of a height of the end portion.

9. The method of claim 1 wherein a width of the recessed member at a widest part thereof is equal to or greater than seventy five percent of a width of the end portion.

10. The method of claim 7 wherein a width of the partial crater portion at a bottom edge of the end portion is equal to or greater than seventy five percent of a width of the end portion.

11. The method of claim 3 wherein the electrical element within the semiconductor device includes a passive semiconductor element.

12. The method of claim 1 wherein the mounting the semiconductor device includes mounting the semiconductor device having the end portion that includes a connection element exposed on the recessed member.

13. The method of claim 12 wherein the connection element includes a metal layer at least partially defining the recessed member.

14. The method of claim 13 wherein the metal layer partially overlaps a first surface of the semiconductor device that opposes the surface of the leadframe substrate, and the metal layer extends through the recessed member.

15. A method, comprising:
attaching a semiconductor die onto a first surface of a carrier substrate, the carrier substrate including a plurality of metal leads surrounding the semiconductor die on the first surface of the carrier substrate;
applying a coupling medium on a first metal lead and a second metal lead of the plurality of metal leads; and
coupling a first end of a semiconductor device to the first metal lead through the coupling medium and a second end of the semiconductor device to the second lead through the coupling medium, the first end of the semiconductor device including a first recess portion facing the first metal lead, and the second end of the semiconductor device including a second recess portion facing the second metal lead.

16. The method of claim 15, comprising applying an encapsulation layer that covers the semiconductor die and the semiconductor device on the first surface of the carrier substrate.

17. The method of claim 15 wherein:
the coupling the first end of the semiconductor device to the first metal lead through the coupling medium includes filling the first recess with the coupling medium, and
the coupling the second end of the semiconductor device to the second metal lead through the coupling medium includes filling the second recess with the coupling medium.

18. A method, comprising:
locally applying an electrically conductive coupling medium on a first metal lead on a surface of a leadframe substrate that includes a semiconductor die on a pad of the leadframe substrate; and
electrically coupling an end portion of a semiconductor device to the first metal lead by at least partially receiving the electrically conductive coupling medium in a recessed portion of the end portion of the semiconductor device, wherein the recessed portion is between a first sidewall and a second sidewall of the end portion.

19. The method of claim 18 wherein the recessed portion of the semiconductor device is adjacent to at least two meeting surfaces of the semiconductor device.

20. The method of claim 18 wherein the recessed portion of the semiconductor device includes a conductive element.

* * * * *